(12) United States Patent
Amthor et al.

(10) Patent No.: US 11,656,307 B2
(45) Date of Patent: May 23, 2023

(54) ACOUSTIC SHIELD FOR A MAGNETIC RESONANCE IMAGING MAGNET ASSEMBLY

(71) Applicant: KONINKLIJKE PHILIPS N.V., Eindhoven (NL)

(72) Inventors: Thomas Erik Amthor, Hamburg (DE); Peter Forthmann, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 57 days.

(21) Appl. No.: 17/598,331

(22) PCT Filed: Mar. 20, 2020

(86) PCT No.: PCT/EP2020/057731
§ 371 (c)(1),
(2) Date: Sep. 27, 2021

(87) PCT Pub. No.: WO2020/193389
PCT Pub. Date: Oct. 1, 2020

(65) Prior Publication Data
US 2022/0179021 A1    Jun. 9, 2022

(30) Foreign Application Priority Data
Mar. 28, 2019    (EP) ..................... 19165915

(51) Int. Cl.
*G01R 33/385* (2006.01)
*G01R 33/3815* (2006.01)
(52) U.S. Cl.
CPC ..... *G01R 33/3854* (2013.01); *G01R 33/3815* (2013.01)

(58) Field of Classification Search
CPC ..................... G01R 33/3854; G01R 33/3815
See application file for complete search history.

(56) References Cited

U.S. PATENT DOCUMENTS

| 2003/0016018 A1 | 1/2003 | Arz |
| 2004/0032263 A1* | 2/2004 | Renz ................ G01R 33/3854 |
| | | 324/318 |

(Continued)

FOREIGN PATENT DOCUMENTS

| CN | 102680921 A | 4/2012 |
| CN | 108447467 A * | 8/2018 ............ G10K 11/16 |

(Continued)

OTHER PUBLICATIONS

Ma and Sheng; Acoustic metamaterials: From local resonances to broad horizons; Sci. Adv. 2016; 2 : e1501595.

(Continued)

*Primary Examiner* — Daniel R Miller

(57) ABSTRACT

The invention provides for a magnetic resonance imaging system component. The magnetic resonance imaging system component comprises an acoustic shield (124) for a magnetic resonance imaging cylindrical magnet assembly (102). The acoustic shield comprises a cylindrical portion (125) configured for being inserted into a bore (106) of the magnetic resonance imaging cylindrical magnet assembly and for completely covering the bore of the magnetic resonance imaging system. The cylindrical portion comprises a smooth exposed surface (126) configured for facing away from the magnetic resonance imaging cylindrical magnet assembly. The cylindrical portion further comprises an attachment surface (127). The acoustic shield further comprises an acoustic metamaterial layer (128) attached to the attachment surface.

13 Claims, 8 Drawing Sheets

(56) References Cited

U.S. PATENT DOCUMENTS

| | | |
|---|---|---|
| 2004/0061499 A1 | 4/2004 | Stocker |
| 2010/0039111 A1 | 2/2010 | Luekeke et al. |
| 2011/0204891 A1 | 8/2011 | Drake et al. |
| 2019/0139529 A1 | 5/2019 | Viard et al. |

FOREIGN PATENT DOCUMENTS

| | | | |
|---|---|---|---|
| GB | 2422905 A * | 8/2006 | ............. G01R 33/34 |
| WO | 20060118443 A1 | 11/2006 | |
| WO | 20140140996 A1 | 9/2014 | |

OTHER PUBLICATIONS

V Romero-Garcia; Perfect and broadband acoustic absorption by critically coupled sub-wavelength resonators; Nature Scientific Reports 2016; 6:19519 (DOI: 10.1038/srep19519.

Yufan Tang et al.; Deep subwavelength acoustic metamaterial for low-frequency sound absorption; 2017 EPL 118 44002.

Yufan Tang et al.; Hybrid acoustic metamaterial as super absorber for broadband low-frequency sound; Nature Scientific Reports 2017; 7:43340 (DOI: 10.1038/srep43340).

Yu et al "Tunable Acoustic Metamaterial With an Array of Resonanators Acutatuted by Dielectric Elastomer" Extreme Mechanics Letters 12 (2017) p. 37-40.

Tang et al "Supplemental Information for Hybrid Acoustic Metamaterial as Super Absorber for Broadband Low Frenency Sound".

Gemin Li et al "A Comprehensive Experimental Study of Micro-Perforated Panel Acoustic Absorbers in MRI Scanners" Magnetic Resonance in Physics vol. 23, No. 3 May 13, 2010 p. 177-185.

Cheng "Reducing Interionr Noise in a Cylinder Using Micro-Performated Panels" Applied Acoutics, vol. 95, Mar. 17, 2015 p. 50-56.

Algarin et al "Analysis of the Noise Correlation in MRI Coil Arrays Loaded With Metamaterial Magnetoinductive Lenses" IEEE Transactions on Medical Imaging vol. 34, No. 5, MAY 1015.

International Search Report and Written Opinion from PCT/EP2020/05//31 dated Oct. 1, 2020.

* cited by examiner

ACOUSTIC SHIELD FOR A MAGNETIC RESONANCE IMAGING MAGNET ASSEMBLY

CROSS REFERENCE TO RELATED APPLICATIONS

This application is a U.S. national phase application of International Application No. PCT/EP2020/057731 filed on Mar. 20, 2020, which claims the benefit of EP Application Serial No. 19165915.0 filed on Mar. 28, 2019 and is incorporated herein by reference.

FIELD OF THE INVENTION

The invention relates to magnetic resonance imaging, in particular to the reduction of noise generated during the operation of a magnetic resonance imaging system.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. In addition to a magnet or main magnet, which is used to generate the B0 field, there are also gradient coils which are used to generate gradient magnetic fields.

These gradient coils positioned adjacent to or surrounding a subject, and are fed with current to temporarily generate the gradient magnetic fields. Because the gradient coils are placed within the B0 field, the flow of current within the gradient coils results in mechanical forces being applied to the gradient coils. The result of these mechanical forces is the generation of, potentially very loud, acoustic noise.

The journal article Tang et. al., "Hybrid acoustic metamaterial as super absorber for broadband low-frequency sound," Sci Rep. 2017; 7:43340, doi:10.1038/srep43340 discloses the use of metamaterials for absorbing low-frequency sound. Perforated honeycomb-corrugation hybrid metamaterials (PHCH) as well as other types of metamaterials are disclosed.

The journal article Ma et. al., "Acoustic Metamaterials: From local resonances to broad horizons," Sci. Adv. 2016; 2: e1501595 discloses a variety of acoustic metamaterials.

SUMMARY OF THE INVENTION

The invention provides for a magnetic resonance imaging system component, a magnetic resonance imaging system and a computer program product in the independent claims.

There are several difficulties acoustical shielding a magnetic resonance imaging system. A first difficulty is that the acoustic noise may have a large low-frequency component. Typically, the noise will have a frequency of several hundred Hz to several thousand Hz. Shielding low frequencies typically requires large structure which will not fit within a magnetic resonance imaging system. Another difficulty is that the frequency of the noise is that the gradient pulses used in different magnetic resonance imaging protocols or even within the same magnetic resonance imaging protocol can change. The low frequency noise does not have a constant frequency spectrum.

Embodiments of the invention use acoustic metamaterials to provide for an acoustic shield that is compact, but is still able to absorb the low frequency noise generated by the gradient coils. This may be accomplished by covering the inside of the bore of a cylindrical magnet with an acoustic shield that comprises an acoustic metamaterial.

Some embodiments modify either the structure of the acoustic metamaterials or the air pressure within or surrounding the acoustic metamaterials to adjust the frequencies at which the acoustic metamaterial absorbs noise from the gradient coils. The adjustment of the pressure can be done dynamically so that absorption of sound by the acoustic metamaterial is tailored to the noise being generated by the gradient coils.

In one aspect the invention provides for a magnetic resonance imaging system component. The magnetic resonance imaging system component comprises an acoustic shield for a magnetic resonance imaging cylindrical magnet assembly. The acoustic shield comprises a cylindrical portion configured for being inserted into a bore of the magnetic resonance imaging cylindrical magnet assembly and for completely covering the bore of the magnetic resonance imaging system. The cylindrical portion comprises a smooth exposed surface configured for facing away from the magnetic resonance imaging cylindrical magnet assembly. That is to say the smooth exposed surface faces away from the bore of the magnetic resonance imaging cylindrical magnet assembly.

The cylindrical portion further comprises an attachment surface. The acoustic shield further comprises an acoustic metamaterial layer attached to the attachment surface. This embodiment may be beneficial because during magnetic resonance imaging typically large amounts of acoustic noise are generated. In particular there are gradient coils within the bore of the magnet that can make loud repetitive rapping or tapping noises. The use of the acoustic shield may reduce this acoustic noise and make it more comfortable for a subject who is being imaged.

The magnetic resonance imaging cylindrical magnet assembly may comprise for example a magnet, shims or magnetic shims for the magnet, gradient coils, and other equipment.

In another embodiment the acoustic shield is configured for acoustically sealing the magnetic resonance imaging cylindrical magnet assembly from sounds emanating from the magnetic resonance imaging cylindrical magnet assembly. In some examples this may just be the acoustic shield within the bore of the magnet. In other examples the acoustic shield may cover a larger portion or even the entire magnet. In this case the entire magnetic resonance imaging cylindrical magnet assembly may be acoustically shielded using the acoustic metamaterial layer. This may for example include end caps with acoustic metamaterial on the outside of the magnet.

In another embodiment the acoustic shield further comprises end caps configured for forming an airtight seal between the cylindrical portion and the magnetic resonance imaging cylindrical magnet assembly. The use of the end caps may be beneficial because it has been shown that the absorption of sound for acoustic metamaterials may be pressure-dependent. By using the end caps this may enable the controlling of the pressure and therefore a tuning of the frequency for which the metamaterials absorb sound.

In another embodiment the acoustic metamaterial comprises acoustic phase manipulation structures.

In another embodiment the acoustic metamaterial comprises a locally resonant acoustic metamaterial.

In another embodiment the acoustic metamaterial comprises a series of Helmholtz resonators distributed along a length. For example, the length may be distributed in a direction coaxial with the cylindrical bore of the magnet.

In another embodiment the acoustic metamaterial comprises a perforated honeycomb-corrugation hybrid acoustic metamaterial. This may be beneficial because these types of metamaterials may be very good at absorbing low-frequency sound which may be typically generated by a magnetic resonance imaging system.

In another embodiment the acoustic metamaterial comprises a honeycomb hybrid acoustic metamaterial.

In another embodiment the acoustic metamaterial comprises corrugation hybrid acoustic metamaterial.

In another aspect the acoustic shield comprises an actuator. The acoustic metamaterial comprises individual cells. The cells have a variable volume. That is to say the air space or size of the cells may be changed. The actuator is configured for modifying the variable volume. The cells comprise any one of the following for modifying the variable volume: a bellows, an adjustable concertina-type structure, and a motion between a top and bottom layer. The actuator may be used to control the volume and therefore tune the resonant frequencies or main absorptive acoustic frequency for the acoustic metamaterials.

In another embodiment the acoustic shield comprises an actuator. The acoustic metamaterial comprises cells where at least a portion of the cells each have an opening directed away from the smooth exposed surface. The acoustic shield comprises a moveable layer configured for adjusting the size of the opening. The actuator is configured for adjusting the moveable layer to control the size of the opening. This may be beneficial because adjusting the size of the opening may change the frequency or frequency range at which the acoustic metamaterial thus absorbs sound.

In another embodiment the magnetic resonance imaging system component further comprises the magnetic resonance imaging cylindrical magnet assembly. The magnetic resonance imaging system component comprises an air gap between the acoustic metamaterial layer and the magnetic resonance imaging cylindrical magnet assembly.

In another embodiment the magnetic resonance imaging system component further comprises an air pressure control system configured for controlling an air pressure at the air gap to adjust the frequency-dependent acoustic absorption by the acoustic shield. This may be beneficial because the acoustic shield can be adjusted to absorb the sound frequencies that are being most generated by the magnetic resonance imaging system during operation.

The air pressure control system could for example be implemented in different ways. In one example the air pressure control system comprises a pump or other system which is able to provide air pressure. In some examples the acoustic shield may be sealed against the magnetic resonance imaging cylindrical magnet assembly such that the air is trapped. In other examples it may be leaky and a powerful pump or compressed air may be used to blow gas into the air gap and still control the air pressure of the air gap.

In another aspect the invention provides for a magnetic resonance imaging system configured for acquiring magnetic resonance imaging data from an imaging zone. The magnetic resonance imaging system comprises the magnetic resonance imaging system component according to an example. The magnetic resonance imaging system further comprises a pressure monitor for acquiring air pressure data descriptive of the air pressure of the air gap. The pressure monitor forms a control loop to partially control the air pressure control system. This embodiment may be beneficial because it may enable precise control of air pressure in the air gap and therefore precise control of the frequency or frequencies of acoustic noise which are absorbed by the acoustic shield.

In another embodiment the magnetic resonance imaging system further comprises a memory for storing machine-executable instructions and pulse sequence commands. Pulse sequence commands as used herein are commands or data which may be converted into such commands which enable control and operation of the magnetic resonance imaging system. The magnetic resonance imaging system further comprises a processor for controlling the magnetic resonance imaging system.

Execution of the machine-executable instructions causes the processor to acquire the magnetic resonance imaging data by controlling the magnetic resonance imaging system with the pulse sequence commands. In some examples the magnetic resonance imaging data may also be reconstructed into one or more magnetic resonance images.

In another embodiment the pulse sequence commands comprise air pressure commands configured for dynamically controlling the air pressure control system during execution of the pulse sequence commands. For example, the pulse sequence may have an extra field or position for data which can be used to specify a chosen air pressure in the air gap as the pulse sequence commands are executed. This may be beneficial because through the execution of the pulse sequence commands the acoustic noise being generated by the gradient coils of the magnetic resonance imaging system may change over time. By changing the air pressure dynamically in the air gap the acoustic shield can be adapted to the noise that is currently being generated by the magnetic resonance imaging system. The dynamic control of the air pressure control system may be dynamically controlling the air pressure with the pulse sequence commands.

In another embodiment, execution of the machine executable instructions further causes the processor to calculate gradient coils acoustic frequencies using the pulse sequence commands. Execution of the machine executable instructions further cause the processor to calculate the air pressure commands using the gradient coil acoustic frequencies. The gradient coils are supplied with pulsed current. It is straightforward to calculate a frequency spectrum of noise from the gradient pulses. This can be used to calculate the air pressure commands ahead of time or on the fly.

In another embodiment the magnetic resonance imaging system further comprises a microphone system configured for measuring acoustic noise data within the bore of acoustic noise emanating from the magnetic resonance imaging cylindrical magnet assembly. Execution of the machine-executable instructions further causes the processor to acquire the acoustic noise data during the acquisition of magnetic resonance imaging data. Execution of the machine-executable instructions further cause the processor to calculate a noise spectrum by calculating a Fourier transform of the acoustic noise data. Execution of the machine-executable instructions further cause the processor to calculate a pressure set value using the noise spectrum and an acoustic model of the acoustic shield.

The acoustic model may be different forms in different examples. In one example there may simply be a lookup table that provides a pressure value for a given noise frequency. A mathematical model which more completely models a noise range shielded by the acoustic shield may also be used. Execution of the machine-executable instructions further cause the processor to control the air pressure control system using the pressure set valve. This embodiment may be used independently or may also be used with the air pressure commands in the pulse sequence. When used with the air pressure commands the pressure set value may be used to modify the value that was set in the pulse sequence commands. This may provide for more accurate and more dynamic control for reduction of the acoustic noise.

In another embodiment execution of the machine-executable instructions further cause the processor to log the pressure set value in an air pressure log in execution of the machine-executable instructions. Execution of the machine-executable instructions further cause the processor to modify the air pressure commands using the air pressure log. This may for example be used for automatically adding the air pressure commands to the pulse sequence commands. This may enable more consistent and effective reduction of noise from a magnetic resonance imaging system.

In another aspect the invention provides for a computer program product comprising machine-executable instructions for execution by a processor controlling the magnetic resonance imaging system according to an embodiment. The magnetic resonance imaging system further comprises a microphone system configured for measuring acoustic noise data within the bore of the magnetic resonance imaging cylindrical magnet assembly. Execution of the machine-executable instructions causes the processor to acquire the magnetic resonance imaging data by controlling the magnetic resonance imaging system with the pulse sequence commands. The pulse sequence commands comprise air pressure commands configured for dynamically controlling the air pressure control system during execution of the pulse sequence commands.

In another embodiment execution of the machine-executable instructions further cause the processor to acquire acoustic noise data using the microphone system during the acquisition of the magnetic resonance imaging data. Execution of the machine-executable instructions further cause the processor to calculate a noise spectrum by calculating a Fourier transform of the acoustic noise data. Execution of the machine-executable instructions further cause the processor to calculate a pressure set value using the noise spectrum and an acoustic model of the acoustic shield. Execution of the machine-executable instructions further cause the processor to control the air pressure control system using the pressure set valve.

In another aspect execution of the machine-executable instructions further causes the processor to log the pressure set value in an air pressure log during execution of the machine-executable instructions. Execution of the machine-executable instructions further cause the processor to modify the air pressure commands using the air pressure log.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. MRF magnetic resonance data is magnetic resonance data. Magnetic resonance data is an example of medical image data. A Magnetic Resonance Imaging (MRI) image or MR image is defined herein as being the reconstructed two or three dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
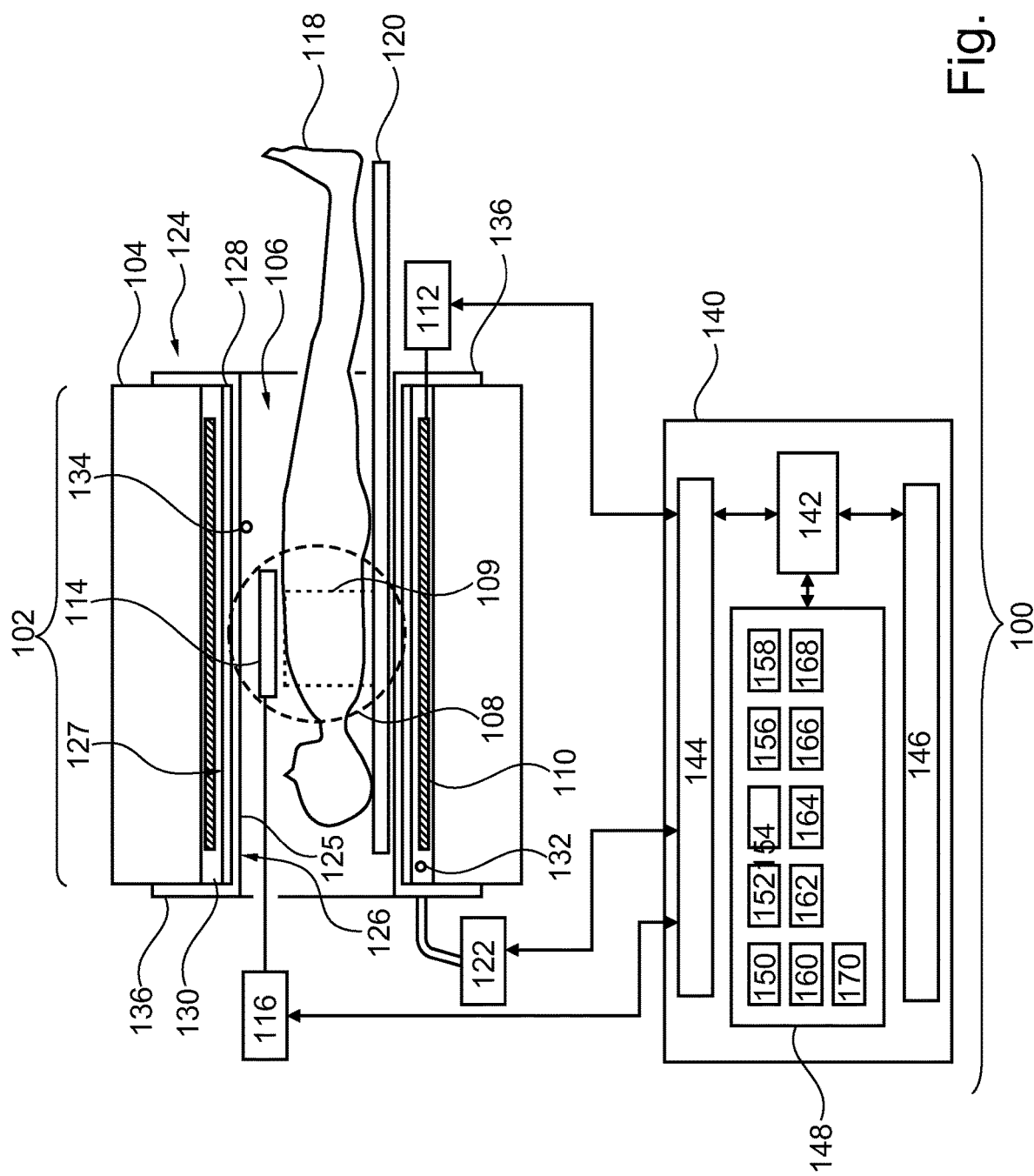
FIG. 1 illustrates an example of a magnetic resonance imaging system.

FIG. 1 illustrates an example of a magnetic resonance imaging system 100. The magnetic resonance imaging system comprises a magnetic resonance imaging cylindrical magnet assembly 102. The cylindrical magnet assembly 102 comprises such things as a magnet 104, gradient coils and shim coils.

The magnet 104 is a superconducting cylindrical type magnet with a bore 106 through it. Within the bore 106 of the cylindrical magnet 104 there is an imaging zone 108 where the magnetic field is strong and uniform enough to perform magnetic resonance imaging. A region of interest 109 is shown within the imaging zone 108. The magnetic resonance data that is acquired typically acquired for the region of interest. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of preliminary magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The magnetic resonance imaging system 100 is further shown as comprising an air pressure control system 122. The air pressure control system 122 may for example provide air or other pressurized gas. The air pressure control system 122 is connected to an acoustic shield 124. The acoustic shield is inside of the bore 106 of the magnet 104. The acoustic shield covers the gradient coils 110. The acoustic shield 124 has a cylindrical portion 125 inserted into the bore 106 of the magnet 104. The acoustic shield 124 has a smooth exposed surface 126 which borders the space in the bore 106. Facing away from the center of the bore 106 is an acoustic metamaterial layer 128 attached to an attachment surface 127. There is an air gap 130 between the acoustic metamaterial layer 128 and the magnetic field gradient coils 110. There is a pressure sensor 132 for measuring the pressure within the air gap 130. The air gap may be sealed or partially sealed from the surrounding atmosphere by the end caps 136.

There is also a microphone or air pressure sensor 134 which may be used for measuring acoustic noise or acoustic air pressure within the bore 106. This may for example be used to determine the noise generated by the gradient coils 110 during the operation of the magnetic resonance imaging system 100.

The transceiver 116 and the gradient controller 112 are shown as being connected to a hardware interface 144 of a computer system 140. The computer system further comprises a processor 142 that is in communication with the hardware system 144, a memory 148, and a user interface 146. The memory 148 may be any combination of memory which is accessible to the processor 142. This may include such things as main memory, cached memory, and also non-volatile memory such as flash RAM, hard drives, or other storage devices. In some examples the memory 148 may be considered to be a non-transitory computer-readable medium.

The memory 148 is shown as containing machine-executable instructions 150. The machine-executable instructions 150 enable the processor 142 to control the operation and function of the magnetic resonance imaging system 100. The machine-executable instructions 150 may also enable the processor 142 to perform various data analysis and calculation functions. The computer memory 148 is further shown as containing pulse sequence commands 152. The pulse sequence commands are configured for controlling the magnetic resonance imaging system 100 to acquire a series of magnetic resonance data from the subject 118 according to a magnetic resonance imaging protocol.

The memory 148 is further shown as containing air pressure commands 154. The air pressure commands 154 may be integrated into the pulse sequence commands 152 and be used to control the air pressure control system 122 dynamically as the pulse sequence commands 152 are being executed. The memory 148 is further shown as containing air pressure data 156 that has been measured with the pressure sensor 132 during execution of the pulse sequence commands 152. As the pulse sequence commands 152 are executed the gradient coils in particular 110 cause acoustic noise. As the different gradient pulses change the frequency component of any acoustic noise may be altered. The air pressure commands 154 may be used to change an air pressure within the air gap 130 to change the frequency absorption properties of the acoustic metamaterial layer 128.

The memory 148 is further shown as containing acoustic noise data 158 that was acquired using the microphone 134. The microphone is understood to measure either sound and/or air pressure. The memory 148 is further shown as containing a Fourier transform 160 of the acoustic noise data 158. This for example may be useful in determining the frequency component of the acoustic noise within the bore 106 of the magnet. The memory 148 is further shown as containing a pressure set value 162 that was used by inputting data from the Fourier transform 160 into an acoustic model 164 of the acoustic shield 124. The pressure set value 162 may be acquired or determined repeatedly during the course of executing the pulse sequence commands 152. These for example may be logged in an air pressure log 166 which is also shown as being in the memory 148. The air pressure log 166 may then be used to either generate and/or alter the air pressure commands 154.

The memory 148 is further shown as containing magnetic resonance imaging data 168 that was acquired by controlling the magnetic resonance imaging system 100 with the pulse sequence commands 152. The memory 148 is further shown as containing a magnetic resonance image 170 that was reconstructed from the magnetic resonance imaging data 168.

Figure 2:
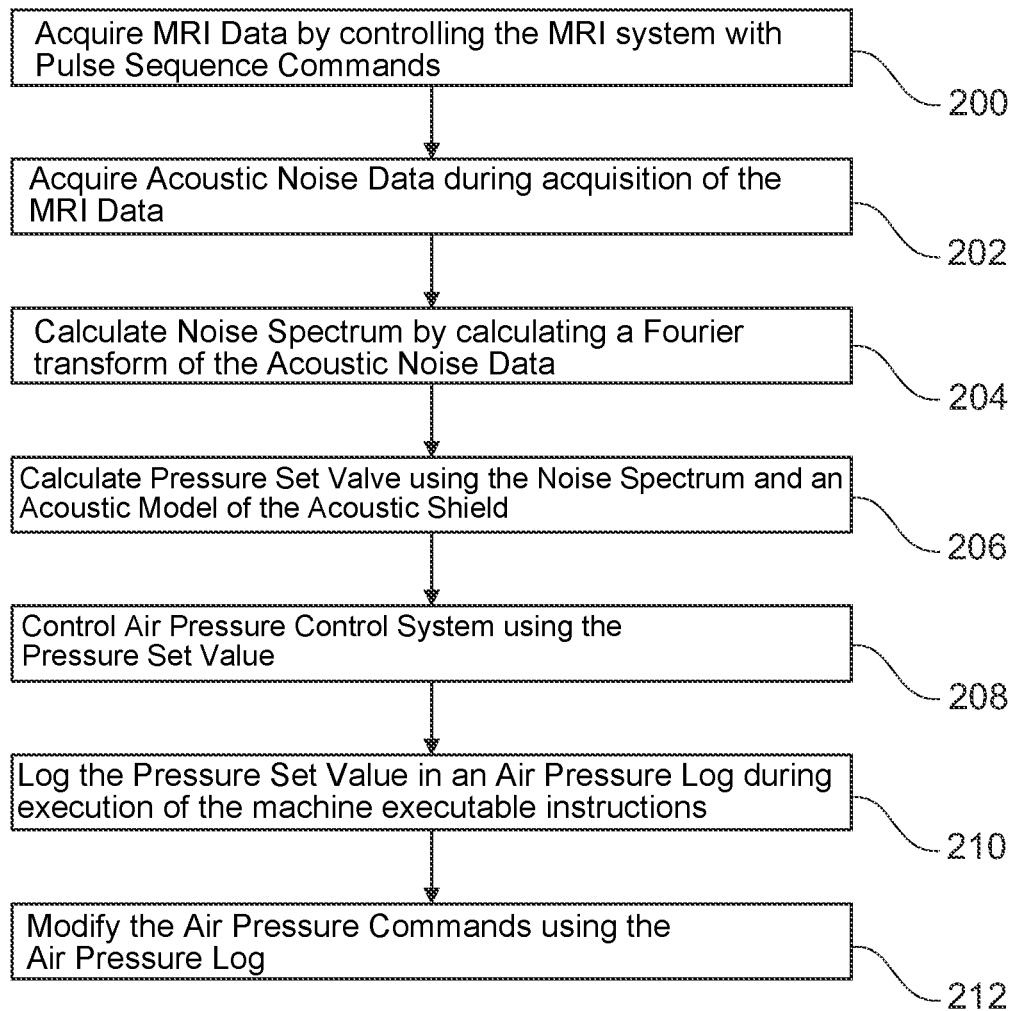
FIG. 2 shows a flow chart which illustrates an example of a method of operating the magnetic resonance imaging system of FIG. 1.

FIG. 2 shows a flowchart which illustrates a method of operating the magnetic resonance imaging system 100 of FIG. 1. First in step 200 the magnetic resonance imaging system 100 is controlled with the pulse sequence commands 152 to acquire the magnetic resonance imaging data 168. The pulse sequence commands 152 may comprise the air pressure commands 154 which may control the air pressure control system 122 to dynamically control the air pressure within the air gap 130. In step 202 the microphone system 134 is controlled to measure the acoustic noise data 158 during execution of the pulse sequence commands 154.

Next in step 204 the noise spectrum 160 is calculated by doing a Fourier transform of the acoustic noise data 158. Then in step 206 the pressure set value 162 is calculated using the noise spectrum 160 and an acoustic model 164 of the acoustic shield. Next in step 208 the air pressure control system 122 is controlled with the pressure set value 162. In some instances, it may be controlled with the pressure set value 162 and/or it may be controlled with values from the air pressure commands 154. Next in step 210 the pressure set value 162 is logged into the air pressure log 166. Then finally, in step 212, the air pressure commands 154 are modified using the air pressure log 166.

Figure 3:
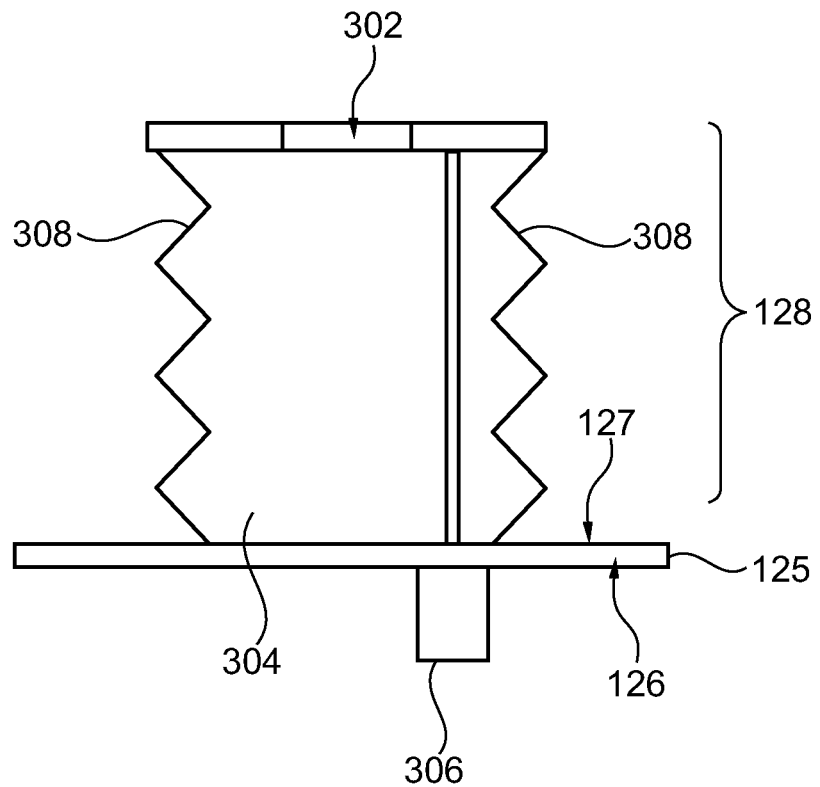
FIG. 3 illustrates an example of a mechanically adjustable acoustic metamaterial.
Figure 3:
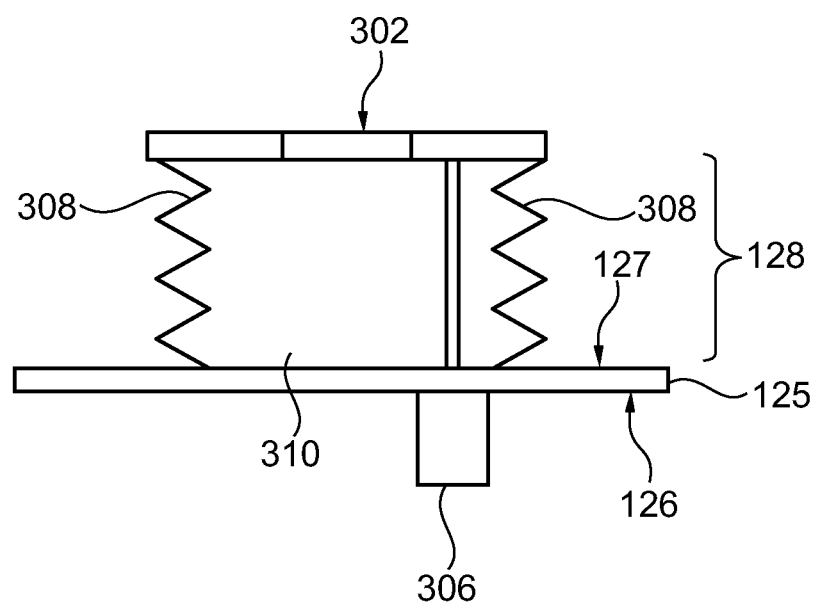

FIG. 3 shows two views of a single cell 300 of an acoustic metamaterial layer 128. This single cell 300 has an air volume 304 which is formed by a bellows 308. At one end there is an opening 302 to the air gap 130. The bellows 308 is connected to an actuator 306. In the lower Fig. the actuator has caused the bellows 308 to contract and which now has a reduced air volume 310. The changing of the air volume from 304 to 310 will cause a change in the sound absorptive properties of the acoustic metamaterial layer 128.

Figure 4:
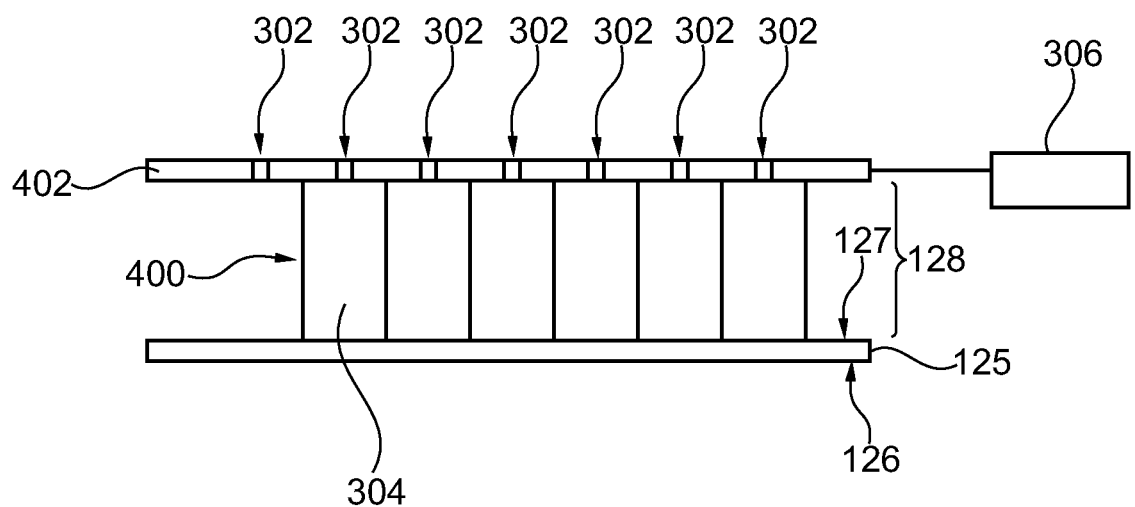
FIG. 4 illustrates a further example of a mechanically adjustable acoustic meta material.
Figure 4:
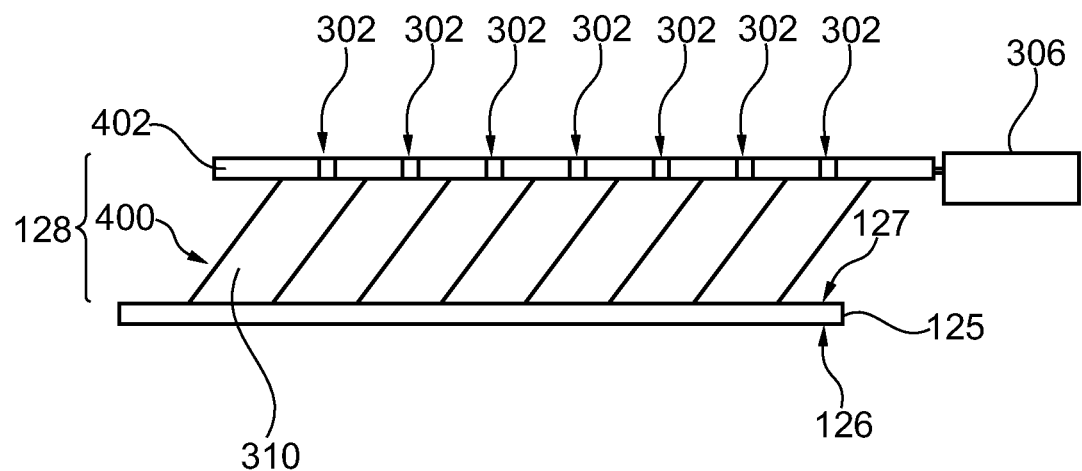

FIG. 4 shows two views of individual cells 400 of an alternative acoustic metamaterial. There is a moveable layer 402 connected to the actuator 306. In the top view the moveable layer 402 is in a relaxed position which maximizes the air volume 304. In the bottom view the moveable layer 402 has been displaced by the actuator in 306. This causes the air volume to become the reduced air volume 310. Again, the change in the air volume from 304 to 310 enables a tuning of the acoustic properties of the acoustic metamaterial layer 128.

Figure 5:
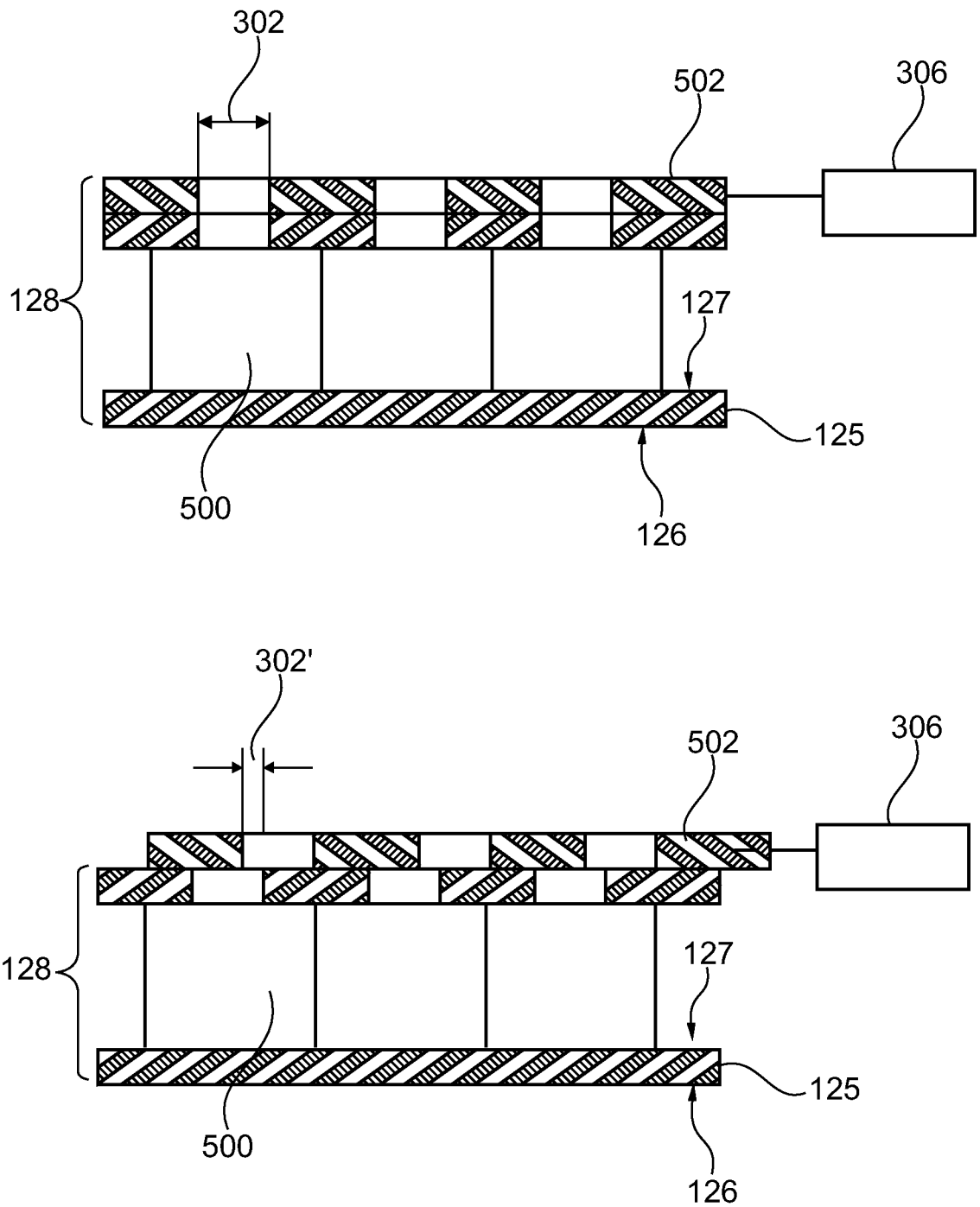
FIG. 5 illustrates a further example of a mechanically adjustable acoustic meta material.

FIG. 5 shows additional cells 500. In this example the cells are fixed and rigid. Instead of changing the volume the opening 302 is adjusted. There is a moveable cover layer 502 with additional holes. The actuator 306 is able to slide the position between the positions in the top and the bottom to change the effective size of the opening 302'. This enables a further tuning of the absorptive properties of the acoustic metamaterial layer 128.

Examples may provide for a sound-absorbing MR cover (acoustic shield 124). It may be manufactured with a layer of, possibly 3D-printed, acoustic metamaterials. This high-efficiency broad-band absorption decreases the sound pressure experienced by the patient, thereby enhancing patient comfort.

The absorption spectrum may in some examples be dynamically adapted to the currently active MR sequence to provide optimum absorption under all scanning conditions. The adaptation of the absorption spectrum is achieved by adjusting the air pressure in the gap between the magnet and the cover.

In recent years, acoustic metamaterials have gained increasing interest in the scientific community. These materials consist of sub-wavelength geometric structures representing coupled oscillators. By designing dedicated structures, e.g. using 3D printing techniques, acoustic metamaterials can be built that have very unusual acoustic properties different from those observed in other passive materials. One application of these materials is a very efficient broadband sound absorption at low frequencies (100 Hz 2000 Hz).

As mentioned above, when operating an MR scanner, switching the electric currents through the gradient coil produces mechanical vibrations that are transformed into sound waves. The patient in the MR bore thus experiences very loud noises. Depending of the MR sequence run, these noises can be at different frequencies.

This invention shows a way to modify the plastic cover between the gradient coil and the patient in a way that makes it sound-absorbing with tunable absorption properties, thereby reducing the noises in the bore and increasing patient comfort.

Examples may provide for:
1. A way of building MR covers, using acoustic metamaterials;
2. A system to modify the sound absorption characteristics of the metamaterials;
3. A system to control the sound absorption modification based on the MR sequence run.

Figure 6:
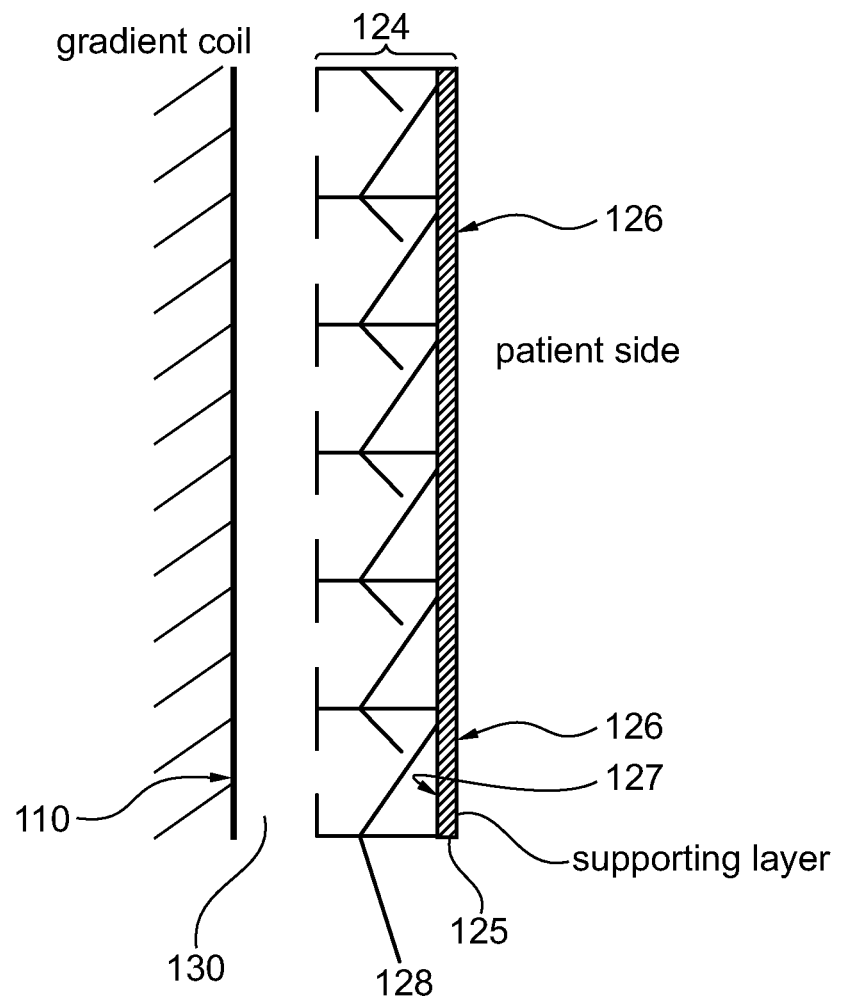
FIG. 6 illustrates an acoustic shield.

FIG. 6 illustrates a close-up view of the installed acoustic shield 124. The acoustic shield 124 is mounted within the bore such that there is an air gap 130 between it and the gradient coils 110. The acoustic shield 124 has a smooth exposed surface 126 facing the patient or interior of the bore. This forms a supporting layer upon which the acoustic metamaterial layer 128 is mounted. This Fig. shows a cross section of the cover and the attachment surface of the gradient coil. The cover (acoustic shield 124) comprises a supporting layer towards the outside (patient side), made of a rigid material such as hard plastics or carbon fiber material. An acoustic metamaterial is built on top of the supporting layer. The metamaterial consists of geometric structures that are designed to absorb sound in a specific frequency range (typically a few hundred up to several thousand Hertz).

Figure 7:
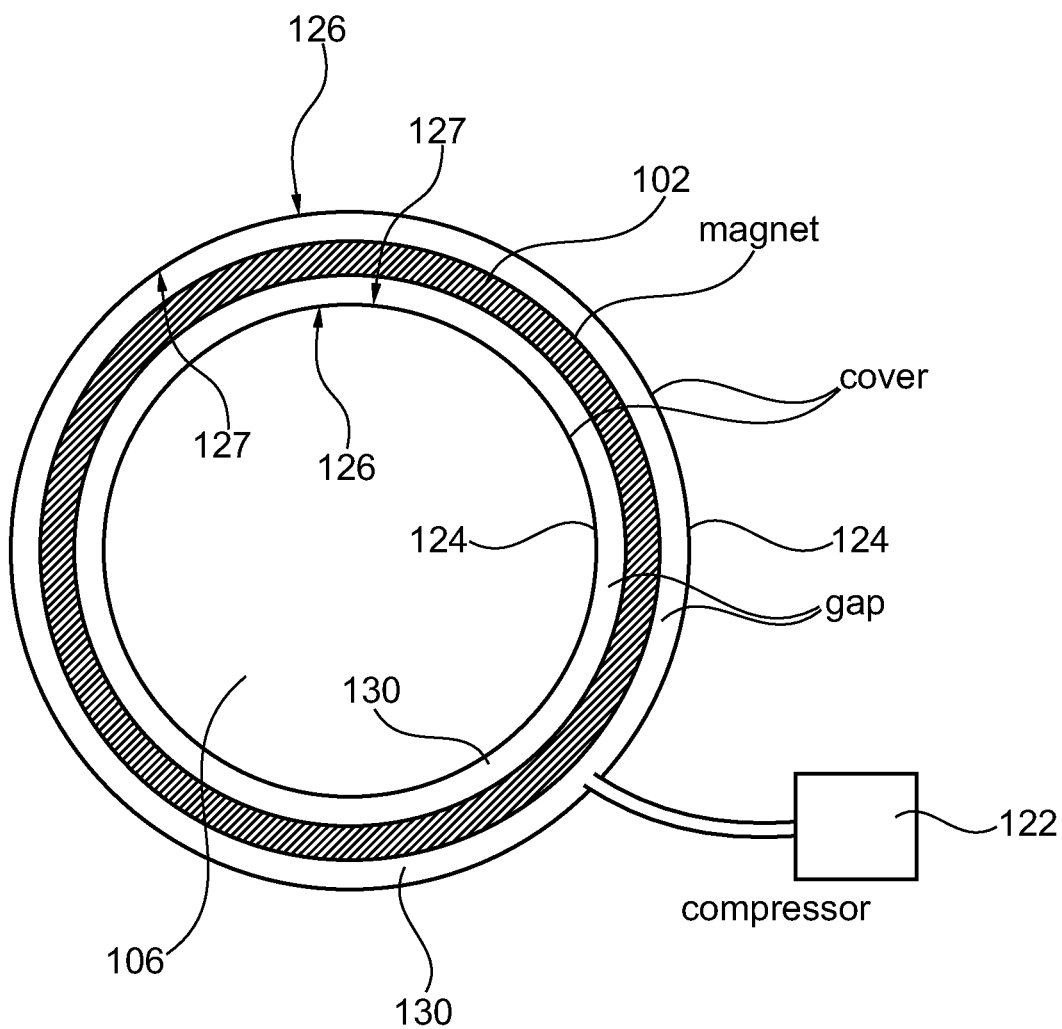
FIG. 7 illustrates the acoustic shielding of a magnetic resonance imaging cylindrical magnet assembly.

FIG. 7 illustrates an alternative embodiment of the acoustic shield 124. In the example illustrated in FIG. 1 the acoustic shield was only present within the bore 106 of the magnet. In this example both the bore 106 and the exterior of the magnet or the magnetic resonance imaging cylindrical magnet assembly 102 is shown. This would then absorb acoustic noise that is actually transmitted through the magnet 102 also. There is a compressor which functions as the air pressure control system 122 and controls the air pressure in both of the gaps 130. This figure shows a cross section of the MR magnet with surrounding cover. The gap between magnet and cover is connected to a compressor/pump unit 122 to adjust the air pressure. In this example, the cover 124 encloses the gradient coil 110 and magnet 104 arrangement completely, so that the gap between the metamaterial and the gradient coil or magnet surface represents a closed volume of air.

The metamaterial is a broad-band sound absorber. Nevertheless, since the MR scanner can be configured to produce sound over a very large frequency range, the absorption properties of the metamaterial must be tuned to the current operating characteristics of the gradient coil. Since the absorption coefficient of acoustic metamaterials depends not only on the geometric arrangement, but also on the density of the air, the peak absorption frequency can be tuned by changing the air pressure in the gap between the magnet and the cover.

A compressor and/or pump (pressure control system 122) is connected to the gap volume to increase or lower the pressure between cover and magnet (thereby modifying the absorption frequencies) depending on the currently run MR sequence. For practical reasons, the air gap cannot be completely sealed, so that the pump must be running continuously to produce a constant pre-selected air pressure. The current Philips MR systems already provide outlets for air flow that may be reused for this purpose.

Figure 8:
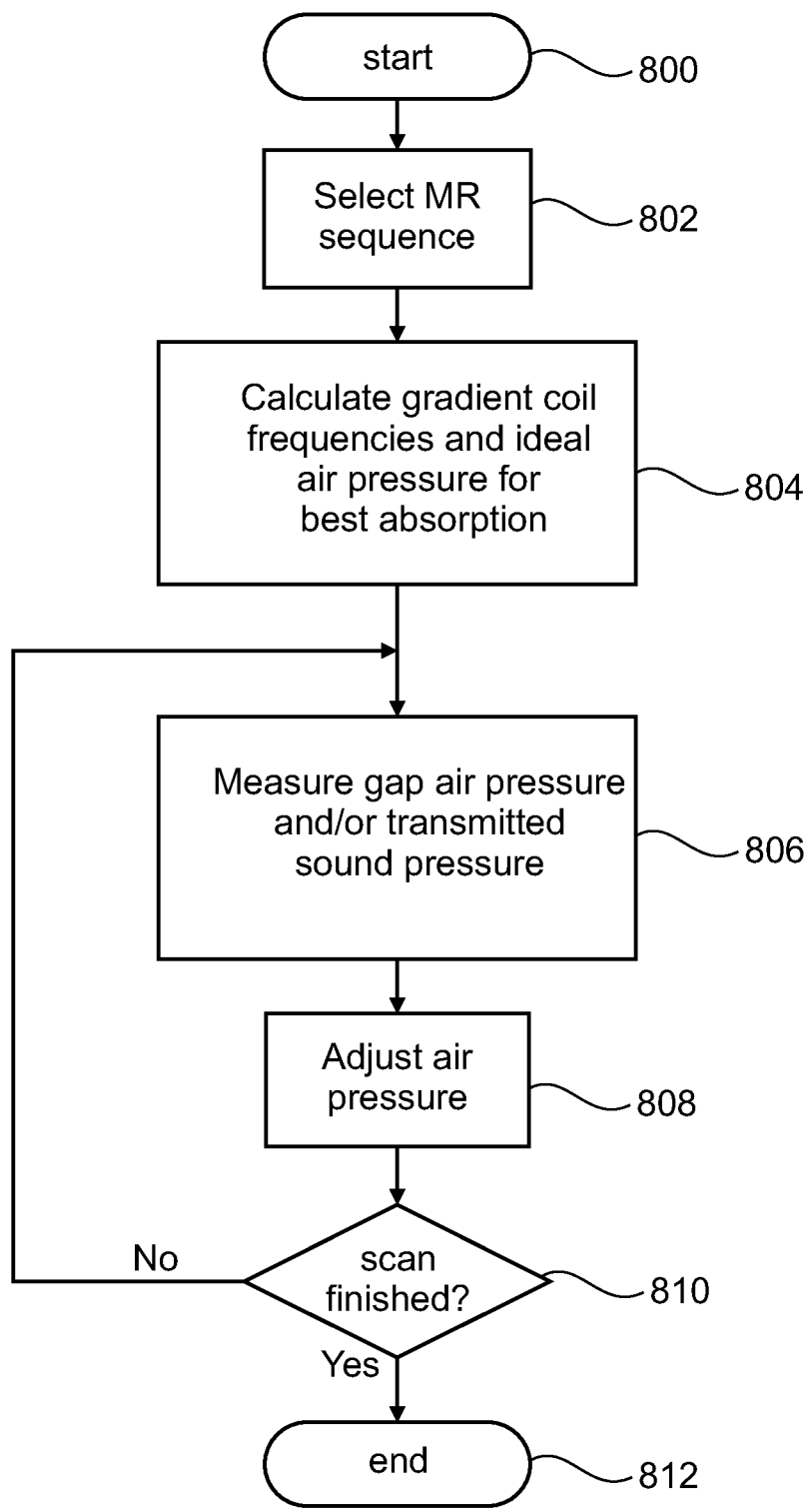
FIG. 8 illustrates a method of operating an acoustic shield.

The procedure for adjusting the metamaterial absorption is depicted in FIG. 8 below. After selection (start) of an MR scan, the expected noise frequency spectrum is calculated from the known gradient waveforms. This information is used to set the pressure within the air gap by running the pressure pump. During the scan, the pressure is constantly readjusted based on measurements of the air pressure and/or measurements of the sound level transmitted through the cover.

FIG. 8 shows a further example of a method of operating the magnetic resonance imaging system 100 of FIG. 1. First in step 800 the method starts. Then in step 802, a magnetic resonance imaging sequence is selected. Then in step 804, the gradient coil frequencies are calculated from the selected magnetic resonance sequence 802 and an ideal air pressure for best absorption is determined. Next in step 806 the air gap pressure and/or transmitted sound pressure is measured. Using this information in step 808 the air pressure in the gap is adjusted. 810 is a decision box and the question is 'is the scan or MR protocol finished?' if the answer is no then the method loops back to step 806. If the scan is finished then the method proceeds to step 812 and the method ends.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
102 magnetic resonance imaging cylindrical magnet assembly
104 magnet
106 bore of magnet
108 imaging zone
109 region of interest
110 magnetic field gradient coils
112 magnetic field gradient coil power supply
114 radio-frequency coil
116 transceiver
118 subject
120 subject support
122 air pressure control system
124 acoustic shield
125 cylindrical portion
126 smooth exposed surface
127 attachment surface
128 acoustic metamaterial layer
130 air gap
132 pressure sensor
134 microphone
136 end caps
140 computer system
142 processor
144 hardware interface
146 user interface
148 computer memory
150 machine executable instructions
152 pulse sequence commands
154 air pressure commands
156 air pressure data
158 acoustic noise data
160 noise spectra
162 pressure set value
164 acoustic model of acoustic shield
166 air pressure log
168 magnetic resonance imaging data
170 magnetic resonance image
200 acquire the magnetic resonance imaging data by controlling the magnetic resonance imaging system with the pulse sequence commands
202 acquire the acoustic noise data during the acquisition of the magnetic resonance imaging data
204 calculate a noise spectrum by calculating a Fourier transform of the acoustic noise data
206 calculate a pressure set value using the noise spectrum and an acoustic model of the acoustic shield
208 control the air pressure control system using the pressure set value
210 log the pressure set value in an air pressure log during execution of the machine executable instructions
212 modify) the air pressure commands using the air pressure log
300 cell
302 opening
302' effective opening size
304 air volume
306 actuator
308 bellows
310 reduced air volume 400 cell
402 movable layer
406 hole
500 cell
502 movable cover layer
800 start
802 select magnetic resonance pulse sequence
804 calculate gradient coil frequencies and ideal pressure for best absorption
806 measure gap air pressure and/or transmitted sound pressure
808 adjust air pressure
810 scan finished?
812 end

The invention claimed is:

1. A magnetic resonance imaging system component, the magnetic resonance imaging system component comprises:
an acoustic shield for a magnetic resonance imaging cylindrical magnet assembly, wherein the acoustic shield includes a cylindrical portion configured for being inserted into a bore of the magnetic resonance imaging cylindrical magnet assembly and for completely covering the bore of the magnetic resonance imaging system, wherein the cylindrical portion includes a smooth exposed surface configured for facing away from the magnetic resonance imaging cylindrical magnet assembly, wherein the cylindrical portion further comprises an attachment surface, wherein the acoustic shield further comprises an acoustic metamaterial layer attached to the attachment surface wherein the magnetic resonance imaging system component further comprises the magnetic resonance imaging cylindrical magnet assembly, wherein the magnetic resonance imaging system component comprises an air gap between the acoustic metamaterial layer and the magnetic resonance imaging cylindrical magnet assembly, and wherein the magnetic resonance imaging system component further comprises an air pressure control system configured for controlling an air pressure of the air gap to adjust a frequency dependency of acoustic absorption by the acoustic shield.

2. The magnetic resonance imaging system component of claim 1, wherein the acoustic shield is configured for acoustically sealing the magnetic resonance imaging cylindrical magnet assembly from sounds emanating from the magnetic resonance imaging cylindrical magnet assembly.

3. The magnetic resonance imaging system component of claim 1, wherein the acoustic shield further comprises end caps configured for forming an air tight seal between the cylindrical portion and the magnetic resonance imaging cylindrical magnet assembly.

4. The magnetic resonance imaging system component of claim 1, wherein the acoustic metamaterial comprises at leat one of any one of the following:
acoustic phase manipulation structures;
locally resonant acoustic metamaterials;
a series of Helmholtz resonators distributed along the length;
a perforated honeycomb-corrugation hybrid acoustic metamaterial;
a honeycomb hybrid acoustic metamaterial; and
a corrugation hybrid acoustic nnetannaterial.

5. The magnetic resonance imaging system component of claim 1, wherein the acoustic shield comprises an actuator, wherein the acoustic metamaterial comprises cells wherein any one of the following:
wherein the cells have a variable volume, wherein the actuator is configured for modifying the variable volume, wherein the cells comprise any one of the following for modifying the variable volume: a bellows, an adjustable concertina type structure, and a movable shear motion between a top and bottom layer;
wherein at least a portion of the cells each have an opening directed away from the smooth exposed surface, wherein the acoustic shield comprises a movable cover layer configured for adjusting a size of the opening, the wherein the actuator is configured for adjusting the movable cover layer to control the size of the opening; and
combinations thereof.

6. A magnetic resonance imaging system configured for acquiring magnetic resonance imaging data from an imaging zone, wherein the magnetic resonance imaging system comprises:
the magnetic resonance imaging system component of claim 1; and
a pressure monitor for acquiring air pressure data descriptive of the air pressure of the air gap, wherein the pressure monitor forms a control loop to at least partially control the air pressure control system.

7. The magnetic resonance imaging system of claim 6, wherein the magnetic resonance imaging system further comprises:
a memory storing machine executable instructions and pulse sequence commands;
a processor for controlling the magnetic resonance imaging system, wherein execution of the machine executable instructions causes the processor to acquire the magnetic resonance imaging data by controlling the magnetic resonance imaging system with the pulse sequence commands.

8. The magnetic resonance imaging of claim 7, wherein the pulse sequence commands comprise air pressure commands configured for dynamically controlling the air pressure control system during execution of the pulse sequence commands.

9. The magnetic resonance imaging system of claim 8, wherein execution of the machine executable instructions further causes the processor to:
calculate gradient coils acoustic frequencies using the pulse sequence commands; and
calculate the air pressure commands using the gradient coil acoustic frequencies.

10. The magnetic resonance imaging system of claim 8, wherein the magnetic resonance imaging system further comprises a microphone system configured for measuring acoustic noise data within the bore of acoustic noise emanating from the magnetic resonance imaging cylindrical magnet assembly, wherein execution of the machine executable instructions further causes the processor to:
acquire the acoustic noise data during the acquisition of the magnetic resonance imaging data;
calculate noise spectrum by calculating a Fourier transform of the acoustic noise data;
calculate a pressure set value using the noise spectrum and an acoustic model of the acoustic shield; and
control air pressure control system using the pressure set value.

11. The magnetic resonance imaging system of claim 10, wherein execution of the machine executable instructions further causes the processor to:
log the pressure set value in an air pressure log during execution of the machine executable instructions;

modify the air pressure commands using the air pressure log.

12. A computer program product comprising machine executable instructions stored on a non-transitory computer readable medium for execution by a processor controlling a magnetic resonance imaging system according to claim 6, wherein the magnetic resonance imaging system further comprises a microphone system configured for measuring acoustic noise data the bore of acoustic noise emanating from the magnetic resonance imaging cylindrical magnet assembly, wherein execution of the machine executable instructions causes the processor to:

acquire magnetic resonance imaging data by controlling the magnetic resonance imaging system with pulse sequence commands, wherein the pulse sequence commands comprise air pressure commands configured for dynamically controlling the air pressure control system during execution of the pulse sequence commands;

acquire the acoustic noise data during the acquisition of the magnetic resonance imaging data;

calculate a noise spectrum by calculating a Fourier transform of the acoustic noise data;

calculate a pressure set value using the noise spectrum and an acoustic model of the acoustic shield; and control the air pressure control system using the pressure set value.

13. The computer program product of claim 12, wherein execution of the machine executable instructions further causes the processor to:

log the pressure set value in an air pressure log during execution of the machine executable instructions;

modify the air pressure commands using the air pressure log.

* * * * *